(12) United States Patent
Mallik et al.

(10) Patent No.: US 8,654,895 B2
(45) Date of Patent: Feb. 18, 2014

(54) FREQUENCY MODULATED SIGNAL DECODING USING A DRIVER

(75) Inventors: Ranajay Mallik, Ghaziabad (IN); Munish Mangal, Amritsar (IN)

(73) Assignee: STMicroelectronics International N.V., Amsterdam (NL)

( * ) Notice: Subject to any disclaimer, the term of this patent is extended or adjusted under 35 U.S.C. 154(b) by 580 days.

(21) Appl. No.: 12/834,704

(22) Filed: Jul. 12, 2010

(65) Prior Publication Data

US 2011/0140739 A1 Jun. 16, 2011

Related U.S. Application Data

(63) Continuation-in-part of application No. 12/719,698, filed on Mar. 8, 2010.

(30) Foreign Application Priority Data

Dec. 15, 2009 (IN) ............................. 2605/DEL/2009

(51) Int. Cl.
*H03K 9/00* (2006.01)

(52) U.S. Cl.
USPC ........................................... 375/316; 332/106

(58) Field of Classification Search
USPC .......................................................... 375/316
See application file for complete search history.

(56) References Cited

U.S. PATENT DOCUMENTS

| | | | | |
|---|---|---|---|---|
| 4,719,532 | A * | 1/1988 | Schneider ...................... | 361/189 |
| 5,059,871 | A * | 10/1991 | Pearlman et al. ............. | 315/316 |
| 5,553,056 | A * | 9/1996 | Bronte et al. ................. | 370/253 |
| 5,914,677 | A * | 6/1999 | Ahmadian ...................... | 341/26 |
| 6,035,240 | A * | 3/2000 | Moorehead et al. ............. | 700/2 |
| 6,077,246 | A * | 6/2000 | Kullas et al. .................. | 604/151 |
| 6,160,354 | A * | 12/2000 | Ruvinskiy et al. ......... | 315/169.3 |
| 7,027,526 | B1 * | 4/2006 | Nehoran et al. .............. | 375/316 |
| 7,038,665 | B1 | 5/2006 | Pandana | |
| 7,177,547 | B1 * | 2/2007 | Case et al. ..................... | 398/135 |
| 7,876,807 | B2 * | 1/2011 | Ray et al. ....................... | 375/136 |
| 8,005,449 | B2 | 8/2011 | Youssoufian et al. | |
| 2002/0196843 | A1* | 12/2002 | Ben-Bassat et al. .......... | 375/219 |
| 2004/0022544 | A1* | 2/2004 | Case et al. ..................... | 398/137 |
| 2005/0096835 | A1* | 5/2005 | Piwonka et al. .............. | 701/115 |
| 2006/0031610 | A1* | 2/2006 | Liav et al. ....................... | 710/66 |
| 2006/0100723 | A1* | 5/2006 | Sun et al. ......................... | 700/61 |
| 2007/0078610 | A1* | 4/2007 | Adams et al. ................... | 702/28 |

(Continued)

FOREIGN PATENT DOCUMENTS

EP 1211344 B1 6/2002

OTHER PUBLICATIONS

"Digial Dial", http://www.massmind.org/images/www/hobby_elec/e_ckt10.htm, Apr. 7, 2010, pp. 1-2.

*Primary Examiner* — Chieh M Fan
*Assistant Examiner* — Santiago Garcia
(74) *Attorney, Agent, or Firm* — Hogan Lovells US LLP (57) ABSTRACT

A system for decoding frequency modulated signals includes a glue logic module, a key matrix, and a driver coupled to the key matrix. The glue logic module provides a pre-scaled frequency signal, while the key matrix receives the pre-scaled frequency signal. The driver decodes the pre-scaled frequency signal to generate at least one event update corresponding to a frequency of the pre-scaled frequency signal.

17 Claims, 3 Drawing Sheets

(56) References Cited

U.S. PATENT DOCUMENTS

| | | |
|---|---|---|
| 2007/0240001 A1 | 10/2007 | Syed et al. |
| 2007/0293817 A1* | 12/2007 | Feng et al. .................. 604/65 |
| 2008/0288748 A1* | 11/2008 | Sutardja et al. ............... 712/20 |
| 2009/0085488 A1* | 4/2009 | Bridges et al. ............... 315/189 |
| 2009/0314079 A1* | 12/2009 | Opitz et al. ................ 73/204.26 |
| 2010/0145328 A1* | 6/2010 | Hancock et al. ............... 606/33 |
| 2011/0121247 A1* | 5/2011 | Houser et al. ............... 254/292 |
| 2012/0020436 A1* | 1/2012 | Wu et al. .................... 375/316 |

* cited by examiner

FREQUENCY MODULATED SIGNAL DECODING USING A DRIVER

CROSS-REFERENCE TO RELATED APPLICATIONS

The present application is a continuation-in-part of U.S. patent application Ser. No. 12/719,698 filed Mar. 8, 2010 and entitled Quadrature Signal Decoding Using a Driver, which claims priority of Indian Patent Application No. 2605/DEL/2009 filed Dec. 15, 2009. Both of said applications are incorporated herein in their entireties by this reference.

TECHNICAL FIELD

The present subject matter relates, in general, to frequency modulated signal decoding using a driver having a key matrix interface and, in particular, to measurement of frequency of the frequency modulated signal using the driver.

BACKGROUND

Appliances such as washing machines and dish washers, include one or more frequency modulated signal sources. Examples of frequency modulated signal sources include, but are not limited to, liquid level sensors. The liquid level sensors may include capacitive plates submerged in a liquid. As a level of liquid changes, the capacitance also changes. Further, a capacitance-to-frequency converter senses the varying capacitance and generates a signal, for example a square wave signal having a frequency that is inversely proportional to capacitance. Thus, the information of the liquid level is encoded in terms of the frequency of the square wave signal.

Such frequency modulated signals can be decoded either by a microcontroller or by an integrated circuit (IC) dedicated for that purpose. For example, a frequency-to-voltage converter may be used to convert the frequency modulated signal into a DC voltage. The DC voltage thus obtained is linearly proportional to the measured capacitance and is thus indicative of the liquid level.

Generally, several bytes of memory are consumed by coding instructions, which are written in the microcontroller, to decode the frequency modulated signals. In addition, extra lines or cables are required to interface the microcontroller with the liquid level sensors. The burden becomes even more pronounced in complex applications where the microcontroller has to attend to critical tasks as well. On the other hand, dedicated ICs that are used for the purpose of decoding frequency modulated signals are not just complex to implement, but are also cost ineffective. In addition, the ICs occupy a substantial fraction of the board real estate.

SUMMARY

This summary is provided to introduce concepts related to decoding of frequency modulated signals using a driver, which are further described below in the detailed description. This summary is not intended to identify essential features of the claimed subject matter nor is it intended for use in determining or limiting the scope of the claimed subject matter.

In one embodiment, the system includes a glue logic module, a key matrix, and a driver coupled to the key matrix. The glue logic module is configured to provide a pre-scaled frequency signal to the key matrix. The driver is configured to decode the pre-scaled frequency signal to generate at least one event update corresponding to a frequency of the pre-scaled frequency signal.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components. For simplicity and clarity of the illustration, elements in the figures are not necessarily to scale.

DETAILED DESCRIPTION OF PREFERRED EMBODIMENTS

Typically, to facilitate operation of appliances, such as dish washers and washing machines, one or more liquid level sensors, for example capacitive sensors are provided with the appliances. The liquid level sensor generates frequency modulated signals corresponding to a level of liquid inside the appliance. Decoding of the frequency modulated signals is generally achieved through a set of instructions in the microcontroller. Based on the level of liquid indicated by the liquid level sensor, the microcontroller chooses a specific action. The specific action may include actions, such as update a light emitting display (LED) display unit, switch off a relay unit, etc.

However, the aforementioned scheme consumes substantial code space within the microcontroller, which can be used instead for other critical tasks. In addition, the interconnections between the liquid level sensor and the microcontroller make the appliances unnecessarily complex. Therefore, some schemes utilize dedicated integrated circuits (ICs) for the purpose of decoding frequency modulated signals. However, the dedicated ICs add to the overall cost of the appliances and are also area consuming.

Therefore, the present subject matter relates to a system and method for decoding frequency modulated signals with reduced complexity and minimal cost. In one implementation, a light emitting diode (LED) driver having a key matrix interface is used to decode the frequency modulated signals generated by the liquid level sensors. Such an LED driver may be already present in the appliances for the purpose of driving eight segment LED display units.

The LED display units, formed from multiple LEDs, are generally provided as a part of a user interface or a front panel of the appliances. The LED drivers are designed to drive the LEDs connected in either a common anode or a common cathode configuration. Further, the LED driver is coupled to a key matrix, which is a matrix of keys or switches. Such a key matrix is also a part of the user interface of the appliances. An event such as a key press can be decoded by the LED driver by scanning the key matrix. For that purpose, each key is individually coupled between a key input and a segment output of the LED driver. The LED driver scans the segment outputs and the key inputs in one scanning cycle, and if any key is pressed, the LED driver senses the key press and updates an internal storage element.

Further, the LED driver sends an interrupt signal to the microcontroller. The microcontroller accordingly reads the storage element and takes a decision for subsequent action corresponding to the key press. The LED display unit, which is coupled to the LED driver, may be updated depending on the action taken by the microcontroller.

Therefore, the LED drivers are enriched with a number of functionalities, for example, capability of driving multiple LEDs, controlling brightness of LEDs, decoding key matrix, and communicating with the microcontroller. The present subject matter relates to configuring such a driver associated with the key matrix interface to decode the frequency modulated signals in a manner similar to the detection of a key press.

In the present implementation, the system for decoding frequency modulated signals includes a liquid level sensor, a glue logic module, a key matrix, and a driver. The glue logic module receives at least one frequency modulated signal from a frequency modulated signal source, such as the liquid level sensor. The frequency modulated signal, in one implementation, is a train of pulses. The system described herein decodes a value of the frequency of the frequency modulated signal. To this, end, the system pre-scales the frequency modulated signal by a pre-scaling coefficient to provide a pre-scaled frequency signal. A logic controlled switch, within the glue logic module, receives the pre-scaled frequency signal, such that the logic controlled switch is activated to switch ON at the same frequency as that of the pre-scaled frequency signal.

Further, the key matrix is coupled to the logic controlled switch and when the driver scans the key matrix, interrupts are generated based on the number of times the logic controlled switch is actuated by the pre-scaled frequency signal thereby emulating periodic and multiple key press events. Accordingly, a microcontroller has instructions stored thereon to count the number of interrupts received in a pre-determined time interval. The number of interrupts is, in turn, indicative of the frequency of the pre-scaled frequency signal. This value can be multiplied further by the pre-scaling coefficient to arrive at the exact frequency of the frequency modulated signal generated by the liquid level sensor. The frequency of the frequency modulated signal is then indicative of the liquid level.

Devices or appliances that can implement the disclosed frequency modulated signals decoding using driver include, but are not limited to, washing machines, dish washers, and other such white goods.

Figure 1:
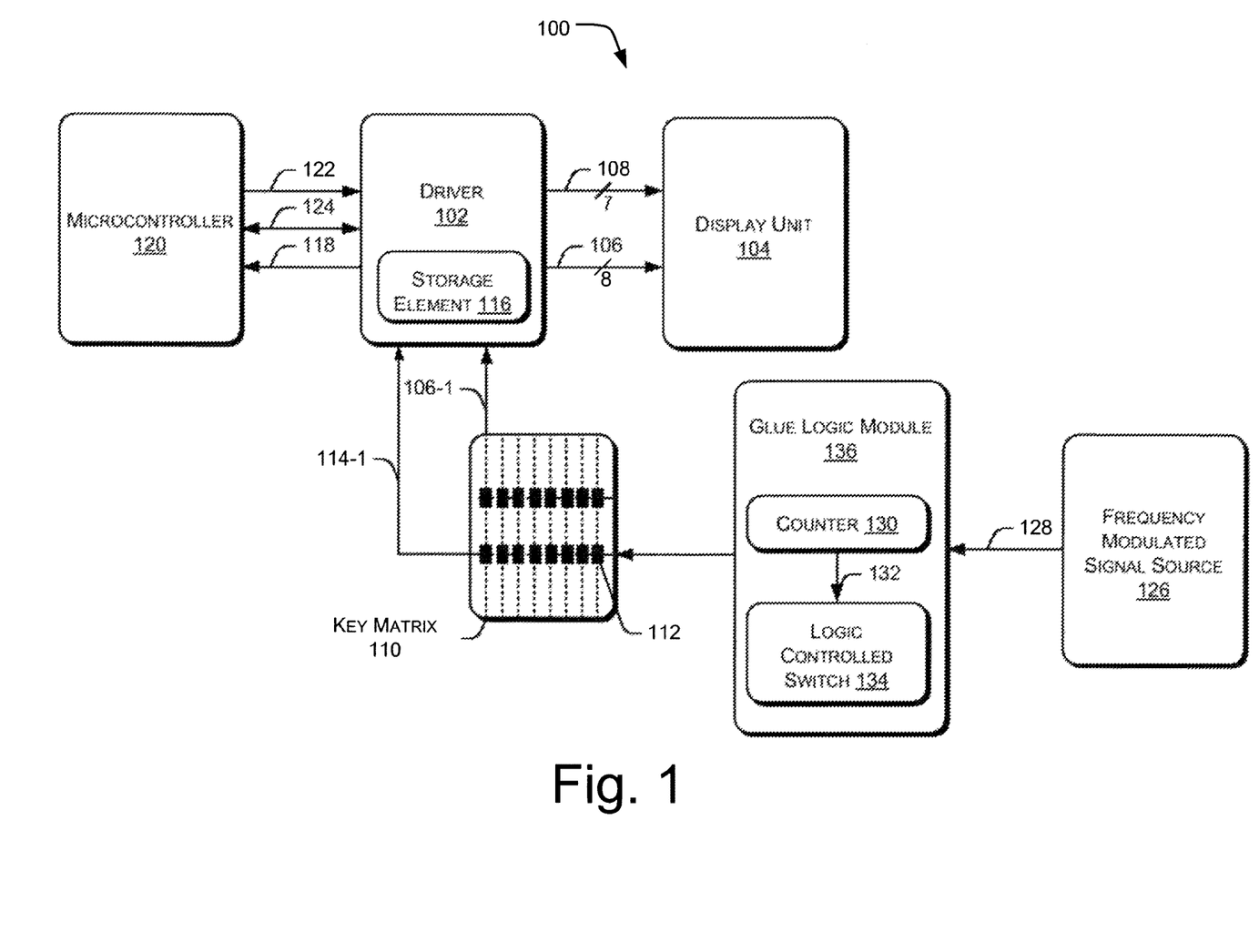
FIG. 1 illustrates an exemplary system for decoding frequency modulated signals, in accordance with an embodiment of the present subject matter.

FIG. 1 illustrates an exemplary system 100 for decoding frequency modulated signals. The system 100 includes a driver 102 configured to drive a display unit 104. The driver 102 may be a light emitting diode (LED) driver configured to drive an eight segment, six digit LED display unit. Alternatively, the driver 102 may be a vacuum fluorescent display (VFD) driver designed to drive a VFD display unit.

The operation and construction of the system 100 is described with reference to certain examples and illustrations. The examples, in no way, should be construed as limiting. In the description to follow, the LED driver and the LED display unit have been used to explain the operation of the system 100. However, it will be appreciated that the following description extends to various driver-display unit configurations in accordance with the present subject matter. Accordingly, some variations may be possible with a change in the driver-display unit configuration, as will be understood by a person skilled in the art.

The driver 102 may be a common anode LED driver, which can be used to drive multiple LEDs (not shown in this figure) using segment outputs 106 and digit outputs 108. In one embodiment, there are eight segment outputs 106-1, 106-2, . . . , 106-8, for an eight segment LED display unit 104 and six digit outputs 108-1, 108-2, . . . , 108-6, for driving six digits of the LED display unit 104. Additionally, there may be one more digit output 108-7 for driving all the digits simultaneously.

The driver 102 adjusts the current provided to each of the LEDs, through an external resistor (not shown in the figure), in conformance with current ratings of the LEDs. In the common anode configuration, the segment outputs 106 sink current from cathodes of the LEDs, while the digit outputs 108 source current to anodes of the LEDs.

The driver 102 may be coupled to a key matrix 110. Generally, the key matrix 110 serves as a user interface or part of the user interface. The key matrix 110 is formed using a set of switches or keys 112, such as key 112-1, key 112-2, . . . , key 112-16, usually arranged in a grid or matrix form. The keys 112 are located at the intersection points of rows and columns of the key matrix 110. An event, for example, a key press, is decoded by the driver 102 by scanning the rows and the columns in a specific manner. For that purpose, each of the rows is coupled to a corresponding key input 114-1 and 114-2. The key inputs 114-1 and 114-2 are collectively referred to as key inputs 114. Additionally, each of the columns is coupled to a corresponding segment output 106-1, 106-2, . . . , 106-8. For example, in a 8×2 key matrix 110, one row is coupled to a key input, namely key input 114-1 of the driver 102, while eight columns are coupled to the eight segment outputs 106 of the driver 102. For illustration purposes, a segment output 106-1 is depicted as one of the eight segment outputs 106 coupled to one of the columns of the key matrix 114. The driver 102 is configured to sequentially scan the segment outputs 106 and the key inputs 114 to decode an event like a key press.

In case a key, such as the key 112-1, from amongst the keys 112 is pressed by the user, the row and column corresponding to the key 112-1 get coupled. Subsequently, the driver 102 scans each column one by one to determine a location of the depressed key 112-1. Such a scan of the key matrix 110 yields that the current in the key input 114-1 corresponding to the depressed key 112-1 is equal to the current in the corresponding segment output, say segment output 116-1, thereby giving the driver 102 an indication that the key 112-1 is pressed.

The key press may be debounced to ensure that the key 112-1 has indeed been pressed. Once the location of the depressed key 112-1 has been correctly determined, a storage element 116 within the driver 102 is updated with, for example, the location of the depressed key 112-1. In one implementation, the storage element 116 is a register. Even though the description herein is in reference to the key 112-1, it will be understood that the description extends to other keys 112 as well.

Furthermore, the driver 102 generates an interrupt signal 118 and provides the interrupt signal 118 to a microcontroller 120. The microcontroller 120 can generate and receive signals, for example, the interrupt signal 118, clock signal 122, etc., based on operational instructions. Among other capabilities, the microcontroller 120 is configured to provide data 124 to the driver 102. The data 124 can be provided in the form of commands. Examples of such commands include configuration commands to configure the driver 102 for displaying the location of the depressed key, data read commands for reading the location of the depressed key 112-1, and memory write commands for writing in a memory of the microcontroller 120. In response to every interrupt signal 118, the microcontroller 120 communicates with the driver 102 to read the storage element 116 and, accordingly, takes an action depending on a configuration of the microcontroller 120. In one example, the microcontroller 120 facilitates display of a value of the depressed key 112-1 on the display unit 104 through the driver 102. In another example, the microcontroller 120 switches a relay unit (not shown in the figure) off.

In addition to the above mentioned components, the system 100 includes a frequency modulated signal source (FMSS) 126. Examples of the FMSS 126 include, but are not limited to, liquid level sensors, paddle flow sensors, air mass sensors, non-contact level measurement ultrasonic sensors, and in general any sensor that provides a variable frequency output signal in response to a change in parameters such as a level of liquid, etc.

In one implementation, the FMSS 126 is capable of generating a square wave signal having variable frequency. In other words, a train of pulses is generated by the FMSS 126. Such a signal is hereinafter referred to as frequency modulated signal 128. Based on the value of a measurement parameter that is a parameter to be measured, such as a level of liquid in the appliance, a frequency of the frequency modulated signal 128 varies. For example, when the liquid level is optimum, a frequency modulated signal 128 having a frequency say 40 KHz is provided. Additionally, the frequency of the frequency modulated signal 128 varies between 37 KHz and 43 KHz based on whether the level of liquid is below or above a threshold value. However, such frequency modulated signals have fast transitions. Therefore, the frequency modulated signal 128 cannot be decoded directly by the driver 102 as the scanning period of driver is generally in the order of microseconds.

To this end, the frequency modulated signal 128 is decoded in two phases. In a first phase, a counter 130 coupled to the FMSS 126, pre-scales the frequency modulated signal 128 to generate a pre-scaled frequency signal 132. The pre-scaled frequency signal 132 is applied to a logic controlled switch 134. The logic controlled switch 134 facilitates in generation of interrupts, which are decoded by the system 100 in a second phase. This is further elaborated in the subsequent paragraphs.

In the first phase, the FMSS 126 senses or measures the measurement parameter, e.g., liquid level and accordingly, generates the frequency modulated signals 128. The frequency modulated signals 128 are provided to a glue logic module 136. In one implementation, the glue logic module 136 includes the counter 130 and the logic controlled switch 134. In said implementation, the counter 130 is configured as a prescaler, to divide the frequency modulated signal 128 by a pre-scaling coefficient and provide the pre-scaled frequency signal 132 such that the pre-scaled frequency signal 132 can be interpreted by the driver 102. For that purpose, the counter 120 may be a ripple carry binary counter. In an example, if the scanning period of the driver 102 is 64 microseconds (μs), a 10-bit binary counter is used to divide the frequency of the incoming frequency modulated signal 128 by a pre-scaling coefficient of 1024. As will be understood a person skilled in the art, the configuration of the counter 130 will vary based on the scanning period of the driver 102 and the maximum frequency of the frequency modulated signal 128.

In said implementation, the pre-scaled frequency signal 132 is applied to the logic controlled switch 134. The logic controlled switch 134, in one embodiment, is a transistor implemented in a common emitter configuration. In another embodiment, the logic controlled switch 134 is any single pole-single throw switch.

In operation, whenever the pre-scaled frequency signal 132 is applied to the logic controlled switch 134, the logic controlled switch 134 switches as many times as the frequency of the pre-scaled frequency signal 132.

In the second phase of decoding the frequency modulated signal 128, the driver 102 scans the key matrix 110, row by row and column by column. When the driver 102 scans the key matrix 110, it appears as if a current from the segment output 106-1 is being sinked, while an equivalent current is being sourced to the key input 114-1. In other words, as and when the logic controlled switch 134 closes, a current flows from the segment output 106-1 toward the key input 114-1. This gives an impression that the key 112-1, at the intersection of the segment output 106-1 and the key input 114-1, has been pressed. Accordingly, the driver 102 also considers one pulse in the frequency modulated signal 128 as one key press and updates its storage element 116 with an event update of the key press.

In one implementation, the storage element 116 may be a multi-bit register, a specific bit, for example most-significant bit, of which gets set when the key 112-1 is pressed. Subsequently, the driver 102 sends the interrupt signal 118 to the microcontroller 120. The microcontroller 120 reads the storage element 116 to determine the source of the interrupt signal 118. If the microcontroller 120 determines that the interrupt signal 118 is generated as a result of a path between the key 114-1 and the segment output 106-1, the microcontroller 120 starts counting the number of interrupt signals 118 received in a pre-determined time interval. In one example, the pre-defined time interval is one second. The number of interrupt signals 118 in the pre-defined time interval, is hereinafter referred to as interrupt count.

Further, based on the interrupt count, the microcontroller 120 may facilitate various actions, for instance, updating the display unit 104, switching off the relay unit. In an example, the microcontroller 120 extrapolates the interrupt count to give a value of the frequency of the frequency modulated signal 128. The frequency, in turn, provides an accurate measure of the parameter, such a liquid level, being measured. In an implementation, the microcontroller 120 facilitates display of the frequency and the measured parameter onto the display unit 104 through the driver 102.

Thus, the frequency modulated signal 128 can be decoded using existing scanning logic of the key matrix 110 present in the system 100. As the algorithm for decoding of the key press events is already implemented in the microcontroller 120, no additional coding is required for decoding of key press events created due to the frequency modulated signal 128. In addition, the number of connections to the microcontroller 120 are also limited, thus reducing the overall cost and complexity of the application in which the system 100 is implemented. An exemplary configuration of the glue logic module 136 is elaborated in subsequent figures to further illustrate its operation.

Figure 2:
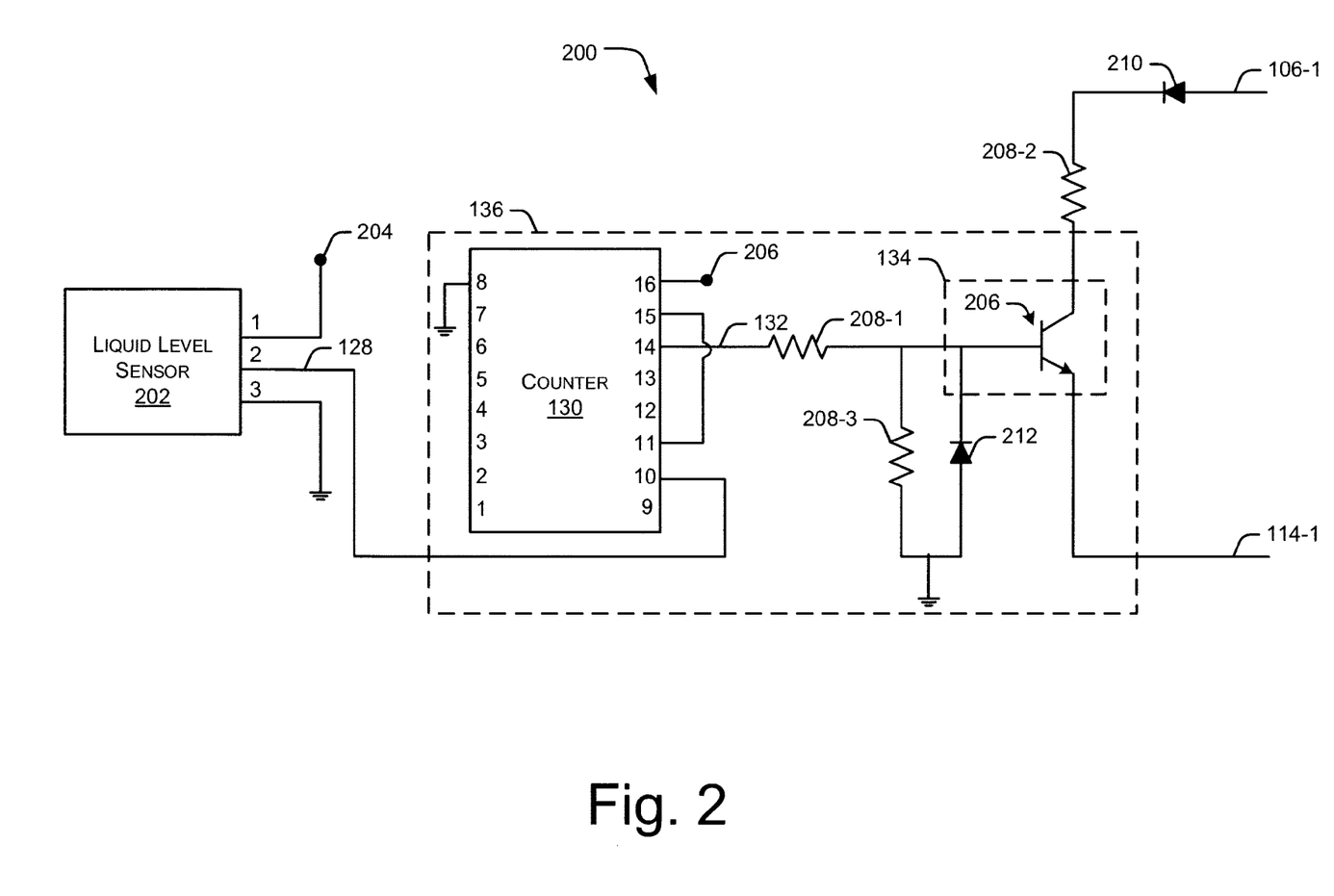
FIG. 2 illustrates an exemplary configuration of a glue logic module, in accordance with an embodiment of the present subject matter.

FIG. 2 illustrates an exemplary configuration 200 of the glue logic module 136, in accordance with an embodiment of the present subject matter. As mentioned before, the glue logic module 136 receives frequency modulated signal 128 from the FMSS 126. In one implementation, the FMSS 126 is a liquid level sensor 202. Generally, the liquid level sensor 202 is used in applications and devices to detect a level of liquid and to generate a square wave signal with frequency varying depending on the level of liquid. The illustration, hereinafter, is in terms of the liquid level sensor 202. However, the explanation can be extended to any device that generates frequency modulated square wave signals, for example, air mass sensors or paddle flow sensors, though with a few modifications, as will be appreciated by a person skilled in the art.

The liquid level sensor 202 generates the frequency modulated signal 128 in response to the level of liquid in the appliance. In construction, the liquid level sensor 202 may include a three-terminal device. A first terminal of the liquid level sensor 202 provides the frequency modulated signal 128, a second terminal is connected to a power supply 204 say 5 volts power supply, and a third terminal is coupled to ground.

The liquid level sensor 202 is tied to the glue logic module 136, in accordance with one embodiment of the present subject matter. Also, in said embodiment, the glue logic module 136 is coupled to the key matrix 110 in order to facilitate decoding of the level of liquid sensed by the liquid level sensor 202.

Further, the glue logic module 136 may include the counter 130, such as IC 4020, and a logic controlled switch 134. The glue logic module 136 may be alternatively implemented using a combination of other pre-scalers or frequency dividers and switches, which provide similar functionalities. Although the present subject matter has been explained in considerable detail with respect to IC 4020, however, it will be appreciated that any other integrated circuits (IC) capable of dividing the frequency of the frequency modulated signal 128 may be used. Additionally, any IC configured to count the number of pulses in a pre-defined interval may be used. Accordingly, connections to various pins of the glue logic module 136 may be modified according to the requirements of the application, as will be understood by a person skilled in the art.

In said embodiment, the counter 130 is a 14-bit/16-pin IC that functions as a ripple carry binary counter. Additionally, in said embodiment, the counter 130 is a divide by $2^{10}$. All the counter stages are master-slave flip-flops. The state of the counter 130 advances one count on a negative transition of the frequency modulated signal 128 received on pin 10 of the counter 130. It should be noted that since pin 11 (i.e., reset pin) and pin 15 are tied to each other, the counter 130 gets reset when the $11^{th}$ bit of the counter 130 becomes logic high. Pin 16 and pin 8 are coupled to the power supply 204 and ground, respectively. In operation, the counter 130 scales down the frequency of the frequency modulated signal 128 to generate the pre-scaled frequency signal 132 at a frequency that is $\frac{1}{1024}^{th}$ times the frequency of the frequency modulated signal 128.

The pre-scaled frequency signal 132 is fed to the logic controlled switch 134. In one embodiment, the logic controlled switch 134 is a transistor, such as a bipolar junction transistor 206, connected in a common emitter configuration. The connections of the transistor 206 are as follows: a base terminal of the transistor 206 receives the pre-scaled frequency signal 132 through a first resistor 208-1, a collector terminal of the transistor 206 is coupled to the segment output 116-1 through a reverse biased current protection diode 210 and a second resistor 208-2, and an emitter terminal of the transistor 206 is coupled to the key input 114-1. The base terminal of the transistor 206 is also connected to another reverse biased current protection diode 212 and a third resistor 208-3. In such a configuration, the user interface is reduced to 15 keys (a 7×2 key matrix and one single key), as one segment output and key input combination is being used for the purpose of decoding the frequency modulated signal 128.

In operation, the liquid level sensor 202 senses a level of liquid in the appliance and accordingly, generates the frequency modulated signal 128. Typically, the frequency modulated signal 128 has a frequency in the range of about 37 KHz to about 43 KHz. However, signals having such fast transitions cannot be properly decoded by the driver 102. In this case, the scanning period of the driver is about 64 microseconds.

Therefore, the frequency modulated signal 128 is divided by a pre-scaling coefficient of 1024 using the counter 130, thus converting the frequency modulated signal 128 into the pre-scaled frequency signal 132. The frequency of the pre-scaled frequency signal 132 is in the range of about 37 Hz to about 43 Hz. It will be understood by a person skilled in the art that the driver 102 may have different scanning period based on which the frequency modulated signal 128 may be divided by different pre-scaling coefficients to yield the pre-scaled frequency signal 132 that can be decoded by the driver 102.

The logic controlled switch 134 receives the pre-scaled frequency signal 132. Since the pre-scaled frequency signal 132 is also a square wave signal, the logic controlled switch 134 switches as and when a high pulse is obtained at the base terminal of the transistor 206. Further, as the logic controlled switch 134 is interfaced in between the segment output 106-1 and the key input 114-1, a current path is formed as and when the logic controlled switch 134 is closed.

As mentioned before, each key is coupled to a key input 114 and a common segment output 106. The driver 102 scans the segment output 106-1 and key inputs 114-1 in one scanning cycle, and if the driver 102 senses that a current from the segment output 106-1 is being sinked, while a current is being sourced to the key input 114-1, the driver 102 registers it as a key press event. Furthermore, the driver 102 updates the storage element 116 with an event update corresponding to the registered key press event and subsequently, generates the interrupt signal 118 for the microcontroller 120. As a result, a number of key presses are detected in response to a pre-scaled frequency signal 132. For example, if the frequency of the prescaled frequency signal 132 is 37 Hz, 37 key press events per second are detected. Accordingly, the storage element 116 within the driver 102 gets updated and the interrupt signal 118 gets generated for every key press event, as already described.

The microcontroller 120 may facilitate various actions. For instance, the microcontroller 120 may increment a counter based on the number of interrupt signals 118 received in a pre-determined time interval, also referred to as interrupt count. In one implementation, the interrupt count is used to determine the frequency of the frequency modulated signal 128 by multiplying the interrupt count with the same pre-scaling coefficient by which the frequency modulated signal 128 was divided in the counter 130. Thus, for a $2^{10}$ counter, the pre-scaling coefficient is 1024.

In this way, a driver, such as the driver 102 having an integrated key matrix scanning feature, can be used to decode the frequency modulated signal 128 in a manner similar to the detection of a key press event.

Figure 3:
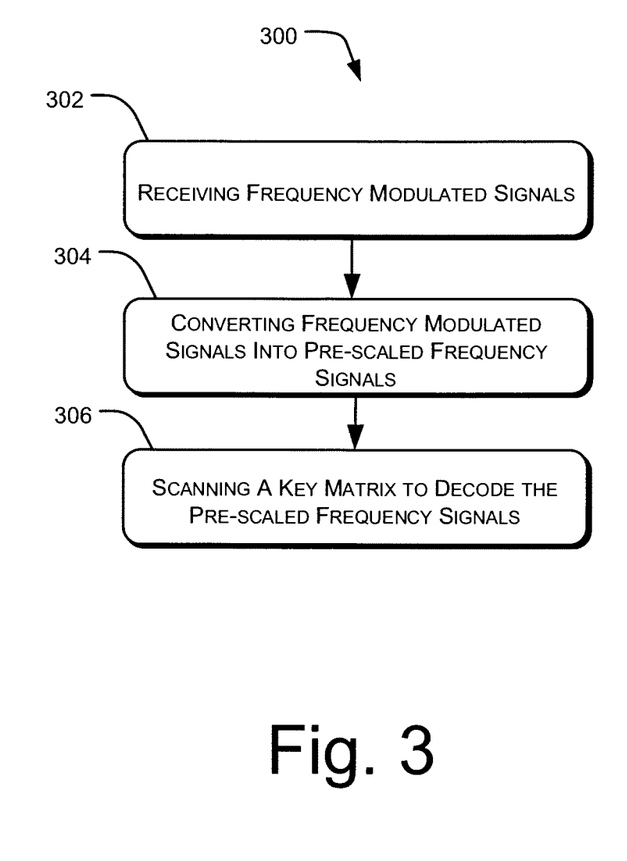
FIG. 3 illustrates an exemplary method diagram for decoding frequency modulated signals, in accordance with an embodiment of the present subject matter.

FIG. 3 illustrates an exemplary method 300 for decoding frequency modulated signals using a driver having a key matrix interface. The exemplary method may be described in the general context of analog and digital circuit elements. However, it will be noted that the method is also implementable through computer executable instructions.

The order in which the method is described is not intended to be construed as a limitation, and any number of the described method blocks can be combined in any order to implement the method, or an alternative method. Additionally, individual blocks may be deleted from the method without departing from the spirit and scope of the present subject matter. Furthermore, the method can be implemented in any suitable hardware, software, firmware, or combination thereof.

At block 302, frequency modulated signals are received from a frequency modulated signal source (FMSS) 126. For example, the FMSS 126, such as the liquid level sensor 202, generates a frequency modulated signal 128 based on a level of liquid in an appliance. In an example, if the level of liquid is optimum, the frequency modulated signal 128 having a frequency say 40 KHz is provided. Additionally, the frequency of the frequency modulated signal 128 varies between 37 KHz and 43 KHz based on whether the level of liquid is below or above a threshold value.

At block 304, the frequency modulated signals 128 are converted into pre-scaled frequency signals 132. The frequency modulated signal 128 is fed to a counter 130 to yield the pre-scaled frequency signal 132. In one implementation, the counter 130 pre-scales, i.e., divides the frequency of the frequency modulated signal 128 by a pre-scaling coefficient. Such a pre-scaling coefficient is determined on the basis of various parameters, such as the maximum frequency of the frequency modulated signal 128 and the scanning period of the driver 102. In an implementation, the driver 102 is coupled to the key matrix 100. Further the driver 102 is configured to decode the frequency modulated signal 128.

Further, the pre-scaled frequency signal 128 is applied to the logic controlled switch 134. Based on the number of high pulses in the pre-scaled frequency signal 128, the logic controlled switch 134 is rendered on or off. Since the logic controlled switch 134 is connected between the segment output 106-1 and the key input 114-1, the current path between the two is formed whenever the logic controlled switch 134 closes.

At block 306, the key matrix 110 is scanned to decode the pre-scaled frequency signal. In one implementation, as and when the logic controlled switch 134 closes, a current path is formed between the segment output 106-1 and the key input 114-1. As mentioned before, each key is coupled to a key input and a common segment output. The driver 102 scans the segment output 106-1 and key inputs 114-1 in one scanning cycle, and if the driver 102 senses that a current from the segment output 106-1 is being sinked, while a current is being sourced to the key input 114-1, the driver 102 registers it as a key press event. Furthermore, the driver 102 updates the storage element 116 with an event update corresponding to the registered key press event and subsequently, generates the interrupt signal 118 for the microcontroller 120. Accordingly, the microcontroller 120 may update the display unit 104, increment another counter, and/or switch off a relay unit, etc.

For example, the microcontroller 120 counts the number of interrupt signals 118 received in a pre-determined time interval, also referred to as interrupt count. In one implementation, the interrupt count is multiplied with the same pre-scaling coefficient by which the frequency modulated signal 128 was divided in the counter 130. In this fashion, the frequency of the frequency modulated signal 128 is obtained. The frequency of the frequency modulated signal 128 is, in turn, used to determine the measurement parameter, for example, liquid level. The method 300 is explained in context of system 100 here, however may be implemented in other systems as well.

Although embodiments for frequency modulated signal decoding using driver have been described in language specific to structural features and/or methods, it is to be understood that the invention is not necessarily limited to the specific features or methods described. Rather, the specific features and methods are disclosed as exemplary embodiments for the frequency modulated signal decoding using the driver.

We claim:

1. A system comprising:
   a glue logic module to provide a pre-scaled frequency signal;
   a key matrix configured to receive the pre-scaled frequency signal;
   a driver coupled to the key matrix, wherein the driver is configured to decode the pre-scaled frequency signal to generate at least one event update corresponding to a frequency of the pre-scaled frequency signal; and
   a frequency modulated signal source to generate at least one frequency modulated signal based on a measurement parameter, wherein the frequency modulated signal source is selected from a group of a liquid level sensors, air mass sensors, and paddle flow sensors,
   wherein the glue logic module comprises a counter to convert the frequency modulated signal into the pre-scaled frequency signal, and
   wherein the counter is selected based on a scanning period of the driver and a maximum frequency of the frequency modulated signal.

2. The system as claimed in claim 1, wherein the key matrix is configured to transfer the pre-scaled frequency signal to the driver through a key input.

3. The system as claimed in claim 1, wherein the glue logic module comprises a logic controlled switch configured to actuate based on the pre-scaled frequency signal.

4. The system as claimed in claim 3, wherein the logic controlled switch comprises a transistor having a collector terminal coupled to a segment output of the driver, a base terminal coupled to the pre-scaled frequency signal, and an emitter terminal coupled to a key input.

5. The system as claimed in claim 1 further comprising a microcontroller coupled to the driver, wherein the driver sends an interrupt signal to the microcontroller to indicate generation of the event update.

6. The system as claimed in claim 5, wherein the microcontroller is configured to facilitate a pre-determined action based on the interrupt signal.

7. The system as claimed in claim 5 further comprising a display unit coupled to the driver, wherein the microcontroller facilitates display of a frequency of a frequency modulated signal onto the display unit through the driver.

8. The system as claimed in claim 1, wherein the driver comprises a storage element to store the event update.

9. A method comprising:
   deriving a pre-scaled frequency signal from a frequency modulated signal, wherein the frequency modulated signal is indicative of a measurement parameter;
   providing the pre-scaled frequency signal to a key matrix through a logic controlled switch;
   scanning the key matrix to decode the pre-scaled frequency signal;
   sourcing the frequency modulated signal selected from a group of a liquid level sensors, air mass sensors, and paddle flow sensors; and
   providing a counter to convert the frequency modulated signal into the pre-scaled frequency signal, wherein the counter is selected based on a scanning period of the driver and a maximum frequency of the frequency modulated signal.

10. The method as claimed in claim 9, wherein the scanning comprises updating a storage element based on the scanning.

11. The method as claimed in claim 10 further comprising sending an interrupt signal to a microcontroller based on the updating of the storage element.

12. The method as claimed in claim 9, wherein the scanning comprises generating an event update corresponding to each pulse in the frequency modulated signal based on a current between a segment output and a key input.

13. The method as claimed in claim 9, wherein the scanning comprises incrementing a counter based on a number of event updates received in a pre-determined time interval, and wherein the number of the event updates is indicative of the measurement parameter.

14. The method as claimed in claim 9, wherein the scanning comprises providing a value of the measurement parameter on a display unit through the driver.

15. The method as claimed in claim 9, wherein the scanning comprises initiating an action based on the measurement parameter.

16. A system comprising:
   a glue logic module to provide a pre-scaled frequency signal;
   a key matrix configured to receive the pre-scaled frequency signal;
   a driver coupled to the key matrix, wherein the driver is configured to decode the pre-scaled frequency signal to generate at least one event update corresponding to a frequency of the pre-scaled frequency signal; and
   a frequency modulated signal source to generate at least one frequency modulated signal based on a measurement parameter,
   wherein the glue logic module comprises a counter to convert the frequency modulated signal into the pre-scaled frequency signal, and wherein the counter is selected based on a scanning period of the driver and a maximum frequency of the frequency modulated signal.

17. A system comprising:
   a glue logic module to provide a pre-scaled frequency signal;
   a key matrix configured to receive the pre-scaled frequency signal; and
   a driver coupled to the key matrix, wherein the driver is configured to decode the pre-scaled frequency signal to generate at least one event update corresponding to a frequency of the pre-scaled frequency signal; and
   a frequency modulated signal source to generate at least one frequency modulated signal based on a measurement parameter,
   wherein the glue logic module comprises a logic controlled switch configured to actuate based on the pre-scaled frequency signal, and wherein the logic controlled switch comprises a transistor having a collector terminal coupled to a segment output of the driver, a base terminal coupled to the pre-scaled frequency signal, and an emitter terminal coupled to a key input, and wherein the glue logic module further comprises a counter that is selected based on a scanning period of the driver and a maximum frequency of the frequency modulated signal.

* * * * *